United States Patent
Yao et al.

(10) Patent No.: US 12,166,109 B2
(45) Date of Patent: Dec. 10, 2024

(54) TRENCH FIELD EFFECT TRANSISTOR STRUCTURE COMPRISING EPITAXIAL LAYER AND MANUFACTURING METHOD THEREOF

(71) Applicant: CHINA RESOURCES MICROELECTRONICS (CHONGQING) CO., LTD., Chongqing (CN)

(72) Inventors: Xin Yao, Chongqing (CN); Wei Jiao, Chongqing (CN); Huarui Liu, Chongqing (CN); Ping Lv, Chongqing (CN)

(73) Assignee: CHINA RESOURCES MICROELECTRONICS (CHONGQING) CO., LTD., Chongqing (CN)

( * ) Notice: Subject to any disclaimer, the term of this patent is extended or adjusted under 35 U.S.C. 154(b) by 253 days.

(21) Appl. No.: 17/616,464

(22) PCT Filed: Dec. 31, 2019

(86) PCT No.: PCT/CN2019/130511
§ 371 (c)(1),
(2) Date: Dec. 3, 2021

(87) PCT Pub. No.: WO2021/103274
PCT Pub. Date: Jun. 3, 2021

(65) Prior Publication Data
US 2022/0328658 A1   Oct. 13, 2022

(30) Foreign Application Priority Data
Nov. 28, 2019 (CN) .......................... 201911192262.1

(51) Int. Cl.
*H01L 29/66* (2006.01)
*H01L 21/265* (2006.01)
(Continued)

(52) U.S. Cl.
CPC .. *H01L 29/66727* (2013.01); *H01L 21/26513* (2013.01); *H01L 29/1095* (2013.01);
(Continued)

(58) Field of Classification Search
CPC .......... H01L 29/1095; H01L 29/66727; H01L 21/26513; H01L 29/407; H01L 29/41741; H01L 29/66734; H01L 29/7813
(Continued)

(56) References Cited

U.S. PATENT DOCUMENTS

2011/0291186 A1* 12/2011 Yilmaz ............... H01L 29/7808
257/334
2013/0323921 A1* 12/2013 Burke ................. H01L 29/7397
257/E21.24
(Continued)

FOREIGN PATENT DOCUMENTS

| CN | 101889334 A | 11/2010 |
|---|---|---|
| CN | 107871787 A | 4/2018 |
| CN | 108400161 A | 8/2018 |

*Primary Examiner* — Didarul A Mazumder
(74) *Attorney, Agent, or Firm* — Global IP Services; Tianhua Gu

(57) ABSTRACT

The present disclosure provides a trench field effect transistor structure and a manufacturing method thereof. The manufacturing method includes: providing a substrate (100), forming an epitaxial layer (101), forming a device trench (102) in the epitaxial layer, and forming a shielding dielectric layer (107), a shielding gate layer (105), a first isolation dielectric layer (108), a gate dielectric layer (109), a gate layer (110), a second isolation dielectric layer (112), a body region (114), a source (115), a source contact hole (118), a source electrode structure (122), and a drain electrode struc-
(Continued)

ture (123). During manufacturing of a trench field effect transistor structure, a self-alignment process is adopted in a manufacturing process, so that a cell pitch is not limited by an exposure capability and alignment accuracy of a lithography machine, to further reduce the cell pitch of the device, improve a cell density, and reduce a device channel resistance.

15 Claims, 9 Drawing Sheets

(51) Int. Cl.
    *H01L 29/10*     (2006.01)
    *H01L 29/40*     (2006.01)
    *H01L 29/417*     (2006.01)
    *H01L 29/423*     (2006.01)
    *H01L 29/78*     (2006.01)

(52) U.S. Cl.
CPC ...... *H01L 29/407* (2013.01); *H01L 29/41741* (2013.01); *H01L 29/66734* (2013.01); *H01L 29/7813* (2013.01)

(58) Field of Classification Search
USPC .................. 257/330; 438/259, 270, 271, 589
See application file for complete search history.

(56) References Cited

U.S. PATENT DOCUMENTS

2014/0264571 A1   9/2014   Lui et al.
2020/0227526 A1*   7/2020   Li ..................... H01L 21/32133

* cited by examiner

TRENCH FIELD EFFECT TRANSISTOR STRUCTURE COMPRISING EPITAXIAL LAYER AND MANUFACTURING METHOD THEREOF

CROSS REFERENCE TO RELATED PATENT APPLICATION

The present application is the US national stage of PCT/CN2019/130511filed on 2019 Dec. 31, which claims the priority of the Chinese patent application No. 201911192262.1 filed on 2019 Nov. 28, which application is incorporated herein by reference.

TECHNICAL FIELD

The present disclosure relates to a power semiconductor technology, and in particular, to a trench field effect transistor structure and a manufacturing method thereof.

BACKGROUND

A shielding gate trench metal-oxide-semiconductor field-effect transistor (MOSFET) device has the advantages of a lower on resistance, a faster switching speed, and the like than a conventional trench MOSFET, and is widely used in the fields such as switching power supply, AC-AC conversion, motor control, radio frequency communication, uninterruptible power supply, and frequency converter. To obtain a high conversion efficiency application system, it is necessary to continuously reduce a switching loss and a conduction loss of the shielding gate trench MOSFET. Reducing the conduction loss means to reduce a specific on-resistance of the shielding gate trench MOSFET.

The most effective method for reducing the specific on-resistance of the shielding gate trench MOSFET is to reduce a device cell pitch, and increase a cell density. However, a smaller device cell pitch indicates a smaller process production safety window, which means a smaller source contact hole size and more accurate lithography machine alignment accuracy are required. However, currently, the smallest lithography size that can be used for power device manufacturing domestically and can be mass-produced is about 0.23 um, and the alignment accuracy of the lithography machine is about 60 nm. Limitation of the traditional process makes it difficult to effectively reduce the device cell pitch continuously. In addition, to maintain a safe process production window, it is required to maintain a certain safety distance between the bottom of a source contact hole and a device channel, and if the alignment accuracy of the lithography machine cannot ensure that a distance between the bottom of the source contact hole and the device trench is beyond the safety distance, an effective concentration of a surface of the device channel would increase, resulting in increasing of a device on voltage and increasing of a device channel resistance. As a result, the specific on-resistance of the device increases, and an electrical parameter of the device would be unstable. Moreover, due to that the shielding gate trench MOSFET structure requires a shielding gate oxide layer with a particular thickness and a shielding gate polycrystalline silicon, and due to the process capability limitation and the device structure requirement, it is difficult for a conventional shielding gate trench MOSFET structure to implement a product with a stable electrical parameter and a relatively small cell unit pitch that can meet the performance of the device. Therefore, it is obligatory for research and development personnel to optimize the device structure design, break through the process limitation, reduce the device cell unit pitch, and reduce the on-resistance.

Therefore, it is very necessary to provide a trench field effect transistor structure and a manufacturing method thereof to resolve the problems in the prior art.

SUMMARY OF THE PRESENT DISCLOSURE

In view of the above disadvantages of the prior art, an objective of the present disclosure is to provide a trench field effect transistor structure and a manufacturing method thereof, to resolve problems that a device manufacturing process is complex, a device cell pitch is difficult to continue to decrease, and the like in the prior art.

In order to achieve the above objective and other objectives, the present disclosure provides a manufacturing method for a trench field effect transistor structure, including the following steps:

providing a substrate of a first doping type, forming an epitaxial layer of the first doping type on the substrate, and forming a plurality of device trenches in the epitaxial layer;

forming a shielding dielectric layer on an inner wall of the device trench, forming a shielding gate layer on a surface of the shielding dielectric layer, filling at least the bottom of the device trench with the shielding gate layer, and forming a first isolation dielectric layer on the shielding gate layer, where the first isolation dielectric layer and the shielding dielectric layer surround the shielding gate layer;

forming a gate dielectric layer on at least side walls of the device trench and the first isolation dielectric layer, so that a gate trench is defined by a surface of the gate dielectric layer, and filling the gate trench to form a gate layer, where an upper surface of the gate layer is lower than an upper surface of the epitaxial layer;

forming, on the gate layer, a second isolation dielectric layer covering at least an exposed surface of the gate layer, and filling the device trench with the second isolation dielectric layer;

etching the epitaxial layer around the device trench based on the second isolation dielectric layer, and performing ion implantation on the etched epitaxial layer in sequence based on the second isolation dielectric layer, to form, between adjacent device trenches, a body region of a second doping type and a source of the first doping type located in the body region, and forming a source contact hole at least in the source, where the source contact hole runs through the source and exposes the body region; and forming, at least in the source contact hole, a source electrode structure that is electrically connected to both the source and the body region, and forming, on one side of the substrate away from the epitaxial layer, a drain electrode structure electrically connected to the substrate.

The present disclosure further provides a trench field effect transistor structure, manufactured preferably by using the manufacturing method consistent with the present disclosure and including:

a substrate of a first doping type;

an epitaxial layer of the first doping type, formed on the substrate, where a plurality of device trenches are formed in the epitaxial layer;

a shielding dielectric layer, formed on the bottom and a part of side walls of the device trench;

a shielding gate layer, formed on a surface of the shielding dielectric layer and filling at least the bottom of the device trench;

a first isolation dielectric layer, formed on the shielding gate layer, where the first isolation dielectric layer and the shielding dielectric layer surround the shielding gate layer;

a gate dielectric layer, formed on at least the side walls of the device trench and a surface of the first isolation dielectric layer, where a gate trench is defined by a surface of the gate dielectric layer;

a gate layer, filling the gate trench, where an upper surface of the gate layer is lower than an upper surface of the epitaxial layer;

a second isolation dielectric layer, formed on the gate layer and covering at least an exposed surface of the gate layer;

a body region of a second doping type, formed in the epitaxial layer between adjacent device trenches;

a source of the first doping type, formed in the body region, where a source contact hole running through the source and exposing the body region is formed in the source;

a source electrode structure, filling at least the source contact hole and electrically connected to both the source and the body region; and a drain electrode structure, formed on one side of the substrate away from the epitaxial layer and electrically connected to the substrate.

As described above, according to a trench field effect transistor structure and a manufacturing method consistent with the present disclosure, a self-alignment process is adopted in a manufacturing process, so that a cell unit pitch is not limited by an exposure capability and alignment accuracy of a lithography machine, to further reduce the cell unit pitch of a device, improve a cell density, and reduce a device channel resistance and a specific on-resistance, so that a device structure with a stable electrical parameter and a low specific on-resistance is obtained. A source electrode structure of a "T"-shaped structure is disposed, to increase a contact area between the source electrode structure and a source and a contact area between the source electrode structure and a body region, thereby effectively reducing a source contact resistance and improving an avalanche tolerance of the device.

DETAILED DESCRIPTION OF THE PREFERRED EMBODIMENTS

Figure 1:
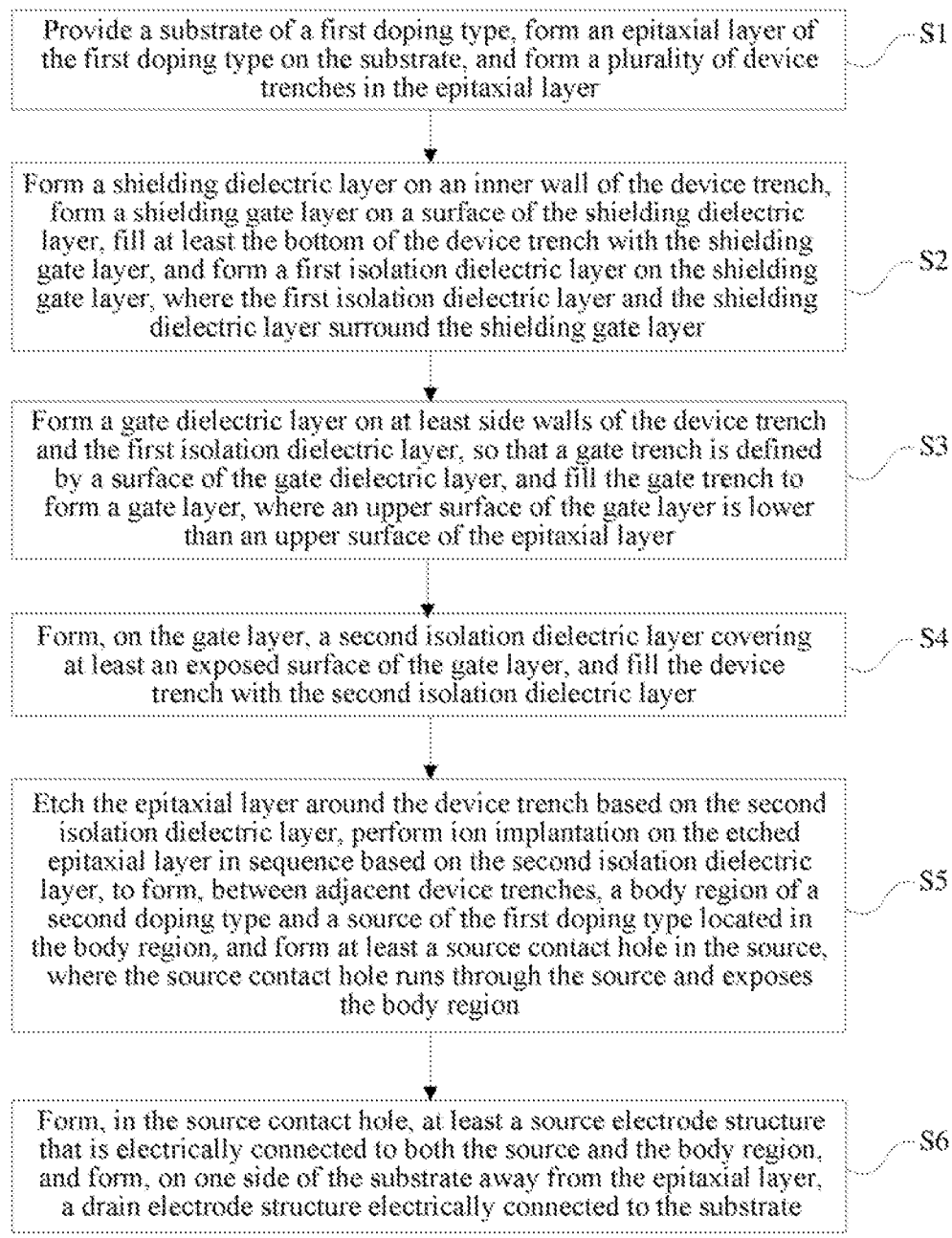
FIG. 1 is a flowchart of a trench field effect transistor manufacturing process consistent with the present disclosure.

As shown in FIG. 1, the present disclosure provides a manufacturing method for a trench field effect transistor structure, including the following steps:

providing a substrate of a first doping type, forming an epitaxial layer of the first doping type on the substrate, and forming a plurality of device trenches in the epitaxial layer;

forming a shielding dielectric layer on an inner wall of the device trench, forming a shielding gate layer on a surface of the shielding dielectric layer, filling at least the bottom of the device trench with the shielding gate layer, and forming a first isolation dielectric layer on the shielding gate layer, where the first isolation dielectric layer and the shielding dielectric layer surround the shielding gate layer;

forming a gate dielectric layer on at least side walls of the device trench and the first isolation dielectric layer, so that a gate trench is defined by a surface of the gate dielectric layer, and filling the gate trench to form a gate layer, where an upper surface of the gate layer is lower than an upper surface of the epitaxial layer;

forming, on the gate layer, a second isolation dielectric layer covering at least an exposed surface of the gate layer, and filling the device trench with the second isolation dielectric layer;

etching the epitaxial layer around the device trench based on the second isolation dielectric layer, and performing ion implantation on the etched epitaxial layer in sequence based on the second isolation dielectric layer, to form, between adjacent device trenches, a body region of a second doping type and a source of the first doping type located in the body region, and forming a source contact hole at least in the source, where the source contact hole runs through the source and exposes the body region; and forming, at least in the source contact hole, a source electrode structure that is electrically connected to both the source and the body region, and forming, on one side of the substrate away from the epitaxial layer, a drain electrode structure electrically connected to the substrate.

The manufacturing method for a field effect transistor structure consistent with the present disclosure is described below in detail with reference to the accompanying drawings.

Figure 2:
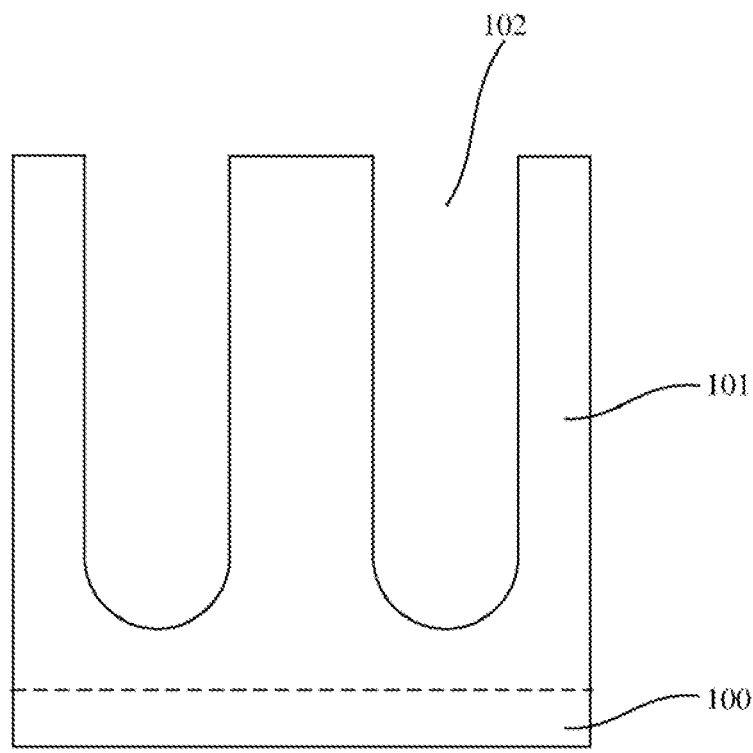
FIG. 2 is a schematic structural diagram of forming an epitaxial layer and a device trench in manufacturing of a trench field effect transistor consistent with the present disclosure.

As shown in Si in FIG. 1 and shown in FIG. 2, a substrate 100 of a first doping type is provided, an epitaxial layer 101 of the first doping type is formed on the substrate 100, and a plurality of device trenches 102 are formed in the epitaxial layer 101.

Specifically, the first doping type (that is, a first conductivity type) may be P-type doping or N-type doping. The substrate 100 may be formed by injecting ions of the first doping type (the P-type or the N-type) into the substrate 100 by using an ion implantation process, and the first doping type is set according to an actual device requirement. In this example, an N-type doped substrate is selected. In addition, in an example, the substrate may be a heavily doped substrate, for example, concentrations of the ions of the first doping type doped in the substrate 100 may be greater than or equal to $1*10^{19}/cm^3$. It should be noted that the substrate 100 may be a silicon substrate, a germanium silicon substrate, a silicon carbide substrate, or the like. In this example, the substrate 100 is an N++-type doped silicon substrate, for example, may be 0.001-0.003 ohm*cm. The first doping type and a second doping type mentioned below (that is, a second conductivity type) are opposite doping (conductivity) types. When a semiconductor of the first doping type (the first conductivity type) is an N-type semiconductor and a semiconductor of the second doping type (the second conductivity type) is a P-type semiconductor, a shielding gate trench MOSFET device consistent with the present disclosure is an N-type device; otherwise, the shielding gate trench MOSFET device consistent with the present disclosure is a P-type device.

A doping type of the epitaxial layer 101 is consistent with a doping type of the substrate 100. In an example. A doping concentration of the epitaxial layer 101 is less than a doping concentration of the substrate 100. An intrinsic epitaxial layer 101 may be first formed on an upper surface of the substrate 100 of the first doping type by using an epitaxial process, and then ions of the first doping type are injected into the intrinsic epitaxial layer 101 by using an ion implantation process, to form the epitaxial layer 101 of the first doping type. In another example, the epitaxial layer 101 of the first doping type may be alternatively formed on an upper surface of the substrate 100 of the first doping type directly by using an epitaxial process. In this example, the epitaxial layer 101 is an N-type monocrystalline silicon epitaxial layer 101.

As an example, the epitaxial layer 101 may be two or more stacked material layers with different concentrations of doping, and a quantity of material layers and a doping concentration of each material layer may be selected according to an actual requirement. In addition, when a plurality of material layers are formed, a position of the device trench 102 may be selected according to an actual requirement, and a specific resistance of the device may be improved based on the setting. For example, the epitaxial layer 101 includes two material layers, the bottom of the device trench 102 is stopped on the upper material layer, that is, at a junction of the two material layers, and the device trench exposes the lower material layer.

In addition, a quantity of device trenches 102 and an arrangement relationship between the device trenches are set according to an actual situation. For example, the device trenches may be a plurality of strip-shaped device trenches 102 arranged in parallel at intervals. The device trench 102 may be formed by using a photolithography-etching process.

As shown in S2 in FIG. 1 and shown in FIG. 3 to FIG. 6, a shielding dielectric layer 107 is formed on an inner wall of the device trench 102, a shielding gate layer 105 is formed on a surface of the shielding dielectric layer 107, at least the bottom of the device trench 102 is filled with the shielding gate layer 105, a first isolation dielectric layer 108 is formed on the shielding gate layer 105, and the first isolation dielectric layer 108 and the shielding dielectric layer 107 surround the shielding gate layer 105. In an example, the shielding gate layer 105 is electrically connected to a subsequently formed source 115 through a layout. In an optional example, the shielding gate layer 105 is lead out in a preset region of the device trench 102 through the layout.

As an example, the step of forming a shielding dielectric layer 107, a shielding gate layer 105, and a first isolation dielectric layer 108 includes the following.

Figure 3:
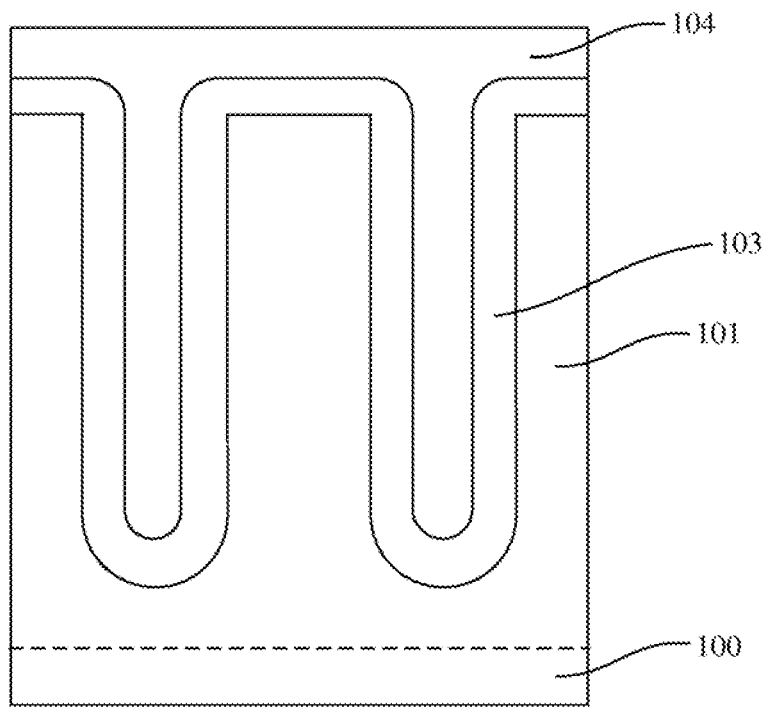
FIG. 3 is a diagram of forming a shielding dielectric material layer and a shielding gate material layer in manufacturing of a trench field effect transistor consistent with the present disclosure.

First, a shielding dielectric material layer 103 is deposited on the inner wall of the device trench 102, and the shielding dielectric material layer 103 further extends onto the epitaxial layer 101 around the device trench 102, as shown in FIG. 3. The shielding dielectric material layer 103 may be formed on the bottom and side walls of the device trench 102 and a surface of the epitaxial layer 101 around the device trench 102 by using a thermal oxidation process or a chemical vapor deposition process, and a material of the shielding dielectric material layer 103 may include, but is not limited to, silicon oxide. In an optional example, a thickness of the shielding dielectric material layer 103, that is, the obtained shielding dielectric layer 107 may be between 800 A and 9000 A, for example, may be 1000 A, 2000 A, or 8000 A, to achieve a good shielding effect.

Subsequently, a shielding gate material layer 104 is deposited on a surface of the shielding dielectric material layer 103, and the shielding gate material layer 104 fills the device trench 102 and extends onto the shielding dielectric material layer 103 around the device trench 102, as shown in FIG. 3. A trench body formed on the surface of the shielding dielectric material layer 103 is filled to form the shielding gate material layer 104 by using a physical vapor deposition process, a chemical vapor deposition process, or the like, and a material of the shielding gate material layer 104 may include, but is not limited to, polycrystalline silicon.

Figure 4:
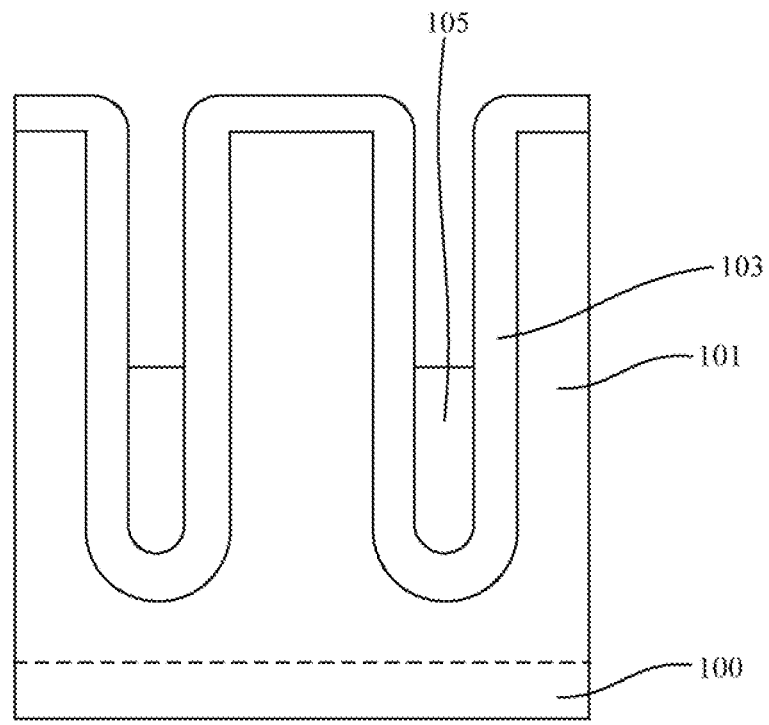
FIG. 4 is a schematic diagram of forming a shielding gate layer in manufacturing of a trench field effect transistor consistent with the present disclosure.

Subsequently, the shielding gate material layer 104 is back-etched, to form the shielding gate layer 105, as shown in FIG. 4. The shielding gate material layer 104 may be etched by using a dry etching process or a wet etching process, and a depth of the shielding gate material layer 104 is etched, that is, a height of the obtained shielding gate layer 105 may be set according to an actual requirement. In an example, a distance between an upper surface of the epitaxial layer 101 and an upper surface of the shielding gate layer 105 is between 12 KA and 18 KA, which may be 14 KA, 15 KA, or KA.

Figure 5:
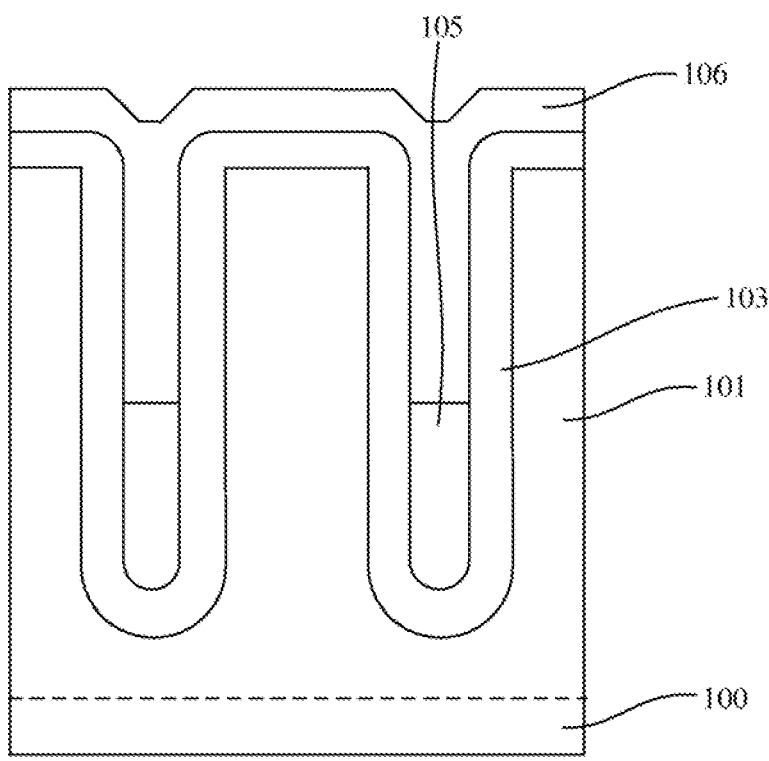
FIG. 5 is a schematic diagram of forming a first isolation dielectric material layer in manufacturing of a trench field effect transistor consistent with the present disclosure.

Continuously, a first isolation dielectric material layer 106 is formed on the shielding gate layer 105, and the first isolation dielectric material layer 106 fills the device trench 102 and extends onto the shielding dielectric material 103 around the device trench 102, as shown in FIG. 5. The first isolation dielectric material layer 106 may be formed by using a physical vapor deposition process, a chemical vapor deposition process, or the like, and a material of the first isolation dielectric material layer 106 includes, but is not limited to, silicon oxide. In a preferred example, a high density plasma oxide layer is deposited by using a high density plasma (HDP) process, to finally form the first isolation dielectric layer 108.

Figure 6:
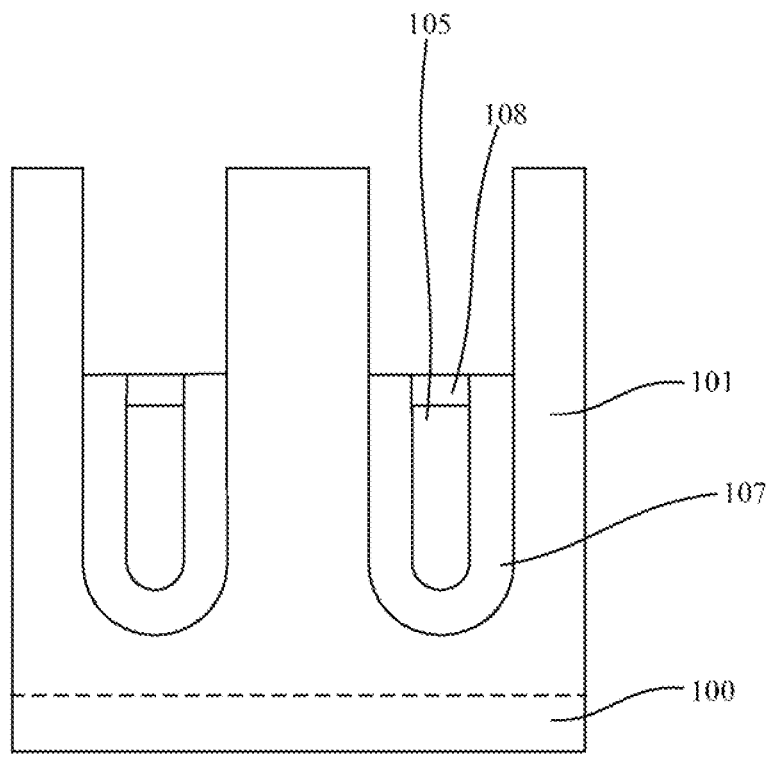
FIG. 6 is a diagram of forming a first isolation dielectric layer and a shielding dielectric layer in manufacturing of a trench field effect transistor consistent with the present disclosure.

Finally, the first isolation dielectric material layer 106 and the shielding dielectric material layer 103 are back-etched, to form the first isolation dielectric layer 108 and the shielding dielectric layer 107, and an upper surface of the first isolation dielectric layer 108 and an upper surface of the shielding dielectric layer 107 are flush with each other and are both lower than the upper surface of the epitaxial layer 101, as shown in FIG. 6. The first isolation dielectric material layer 106 and the shielding dielectric material layer 103 are back-etched, to form the first isolation dielectric layer 108 and the shielding dielectric layer 107 respectively. In an optional example, the material of the first isolation dielectric material layer 106 is the same as the material of the shielding dielectric material layer 103. The first isolation dielectric material layer 106 and the shielding dielectric material layer 103 are first flattened by using a chemically-mechanically polishing (CMP) process to the epitaxial layer 101, and then a part of the first isolation dielectric material layer 106 and a part of the shielding dielectric material layer 103 in the device trench 102 are back-etched by using a dry etching process or a wet etching process. Certainly, the material of the first isolation dielectric material layer 106 may be alternatively different from the material of the shielding dielectric material layer 103. In this case, the first isolation dielectric layer 108 and the shielding dielectric layer 107 may be formed by using a conventional dry etching process or a conventional wet etching process in the art. In an example, a height of the first isolation dielectric layer 108 is between 1500 A and 4500 A, for example, may be 2000 A or 3000 A. In addition, in an optional example, a distance between the upper surface of the epitaxial layer 101 and the upper surface of the first isolation dielectric layer 108 is between 9 KA and 15 KA, which may be 10 KA, 11 KA, or 12 KA.

Certainly, in another example, the shielding dielectric layer 107, the shielding gate layer 105, and the first isolation dielectric layer 108 may be alternatively formed in another manner, and a forming sequence of the shielding dielectric layer 107, the shielding gate layer 105, and the first isolation dielectric layer 108 may be manufactured according to an actual process and is not limited to the example. For example, a material layer of the shielding dielectric layer 107 may be first formed through deposition, the material layer is back-etched to form the shielding dielectric layer 107, and then the shielding gate layer 105 and the first isolation dielectric layer 108 are formed. Alternatively, a material layer of the shielding dielectric layer 107 and a material layer of the shielding gate layer 105 may be first formed through deposition in sequence, the two material layers are back-etched by using a dry etching process or a wet etching process to form the shielding dielectric layer 107 and the shielding gate layer 105, and finally a material layer of the first isolation dielectric layer 108 is formed through deposition, and the material layer is back-etched to form the first isolation dielectric layer 108.

Figure 7:
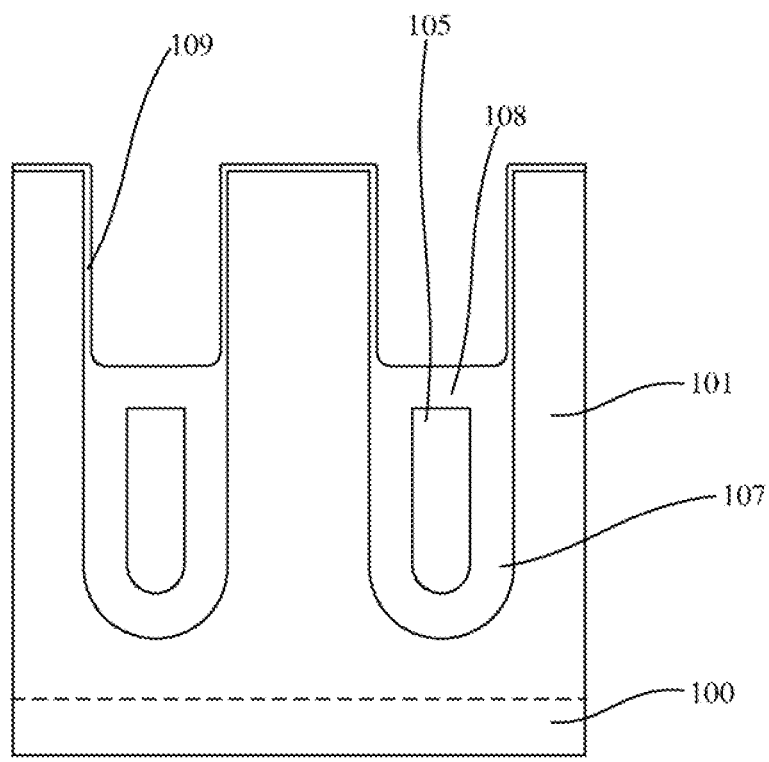
FIG. 7 is a schematic diagram of forming a gate dielectric layer in manufacturing of a trench field effect transistor consistent with the present disclosure.
Figure 8:
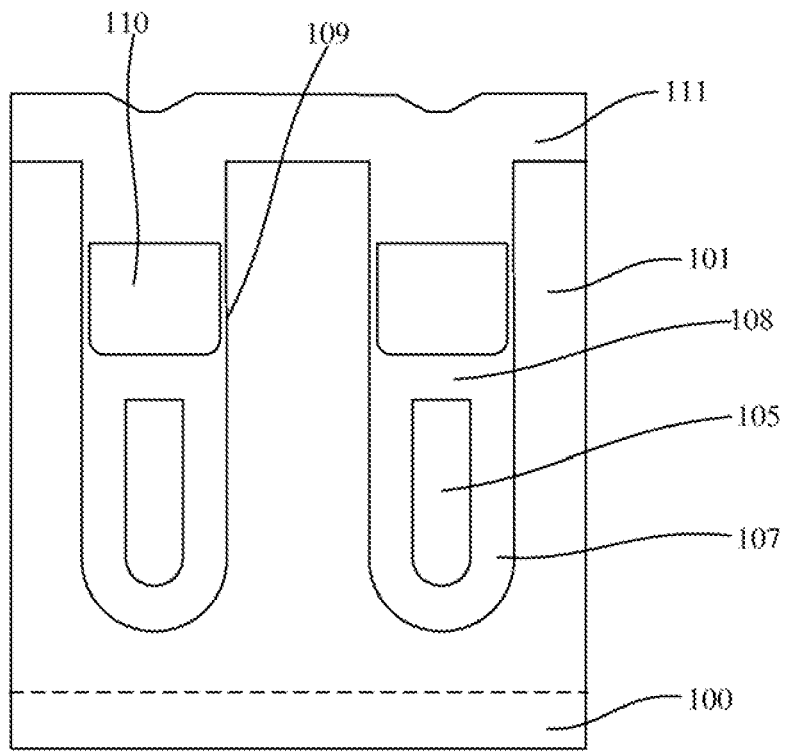
FIG. 8 is a schematic diagram of forming a second isolation dielectric material layer in manufacturing of a trench field effect transistor consistent with the present disclosure.

As shown in S3 in FIG. 1 and shown in FIG. 7 and FIG. 8, a gate dielectric layer 109 is formed on at least side walls of the device trench 102 and the first isolation dielectric layer 108, so that a gate trench is defined by a surface of the gate dielectric layer 109, the gate trench is filled to form a gate layer 110, and an upper surface of the gate layer 110 is lower than the upper surface of the epitaxial layer 101.

Specifically, in an example, the gate dielectric layer 109 is formed on a surface of the first isolation dielectric layer 108 and extends onto the upper surface of the shielding dielectric layer 107 and the inner wall of the device trench 102. Certainly, in another example, an upper surface of the formed gate dielectric layer 109 may be further flush with the upper surface of the epitaxial layer 101, and the upper surface of the gate layer 110 is lower than the upper surface of the epitaxial layer 101. The step of forming the gate layer 110 includes: depositing a gate material layer in the gate trench defined by the surface of the gate dielectric layer 109, where the gate material layer may be formed by using a chemical vapor deposition process, back-etching the gate material layer to form the gate layer 110, where the gate material layer may be back-etched by using a dry etching process or a wet etching process, and an upper surface of the formed gate layer 110 is lower than the upper surface of the gate dielectric layer 109 and is lower than the upper surface of the epitaxial layer 101. In an example, a distance between the upper surface of the epitaxial layer 101 and the upper surface of the gate layer 110 is between 3 KA and 6 KA, which may be 4 KA or 5 KA. The gate dielectric layer 109 may be formed by using a thermal oxidation process, the gate dielectric layer 109 may be a silicon oxide layer or a high dielectric constant dielectric layer, but is not limited thereto, and a material of the gate layer 110 includes, but is not limited to, polycrystalline silicon.

Figure 9:
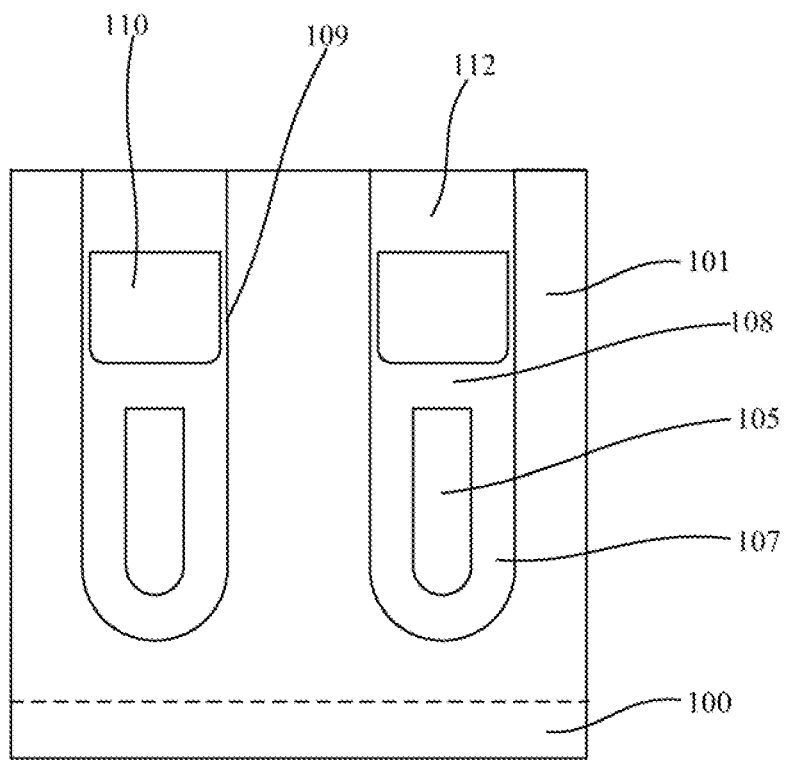
FIG. 9 is a schematic diagram of forming a second isolation dielectric layer in manufacturing of a trench field effect transistor consistent with the present disclosure.
Figure 10:
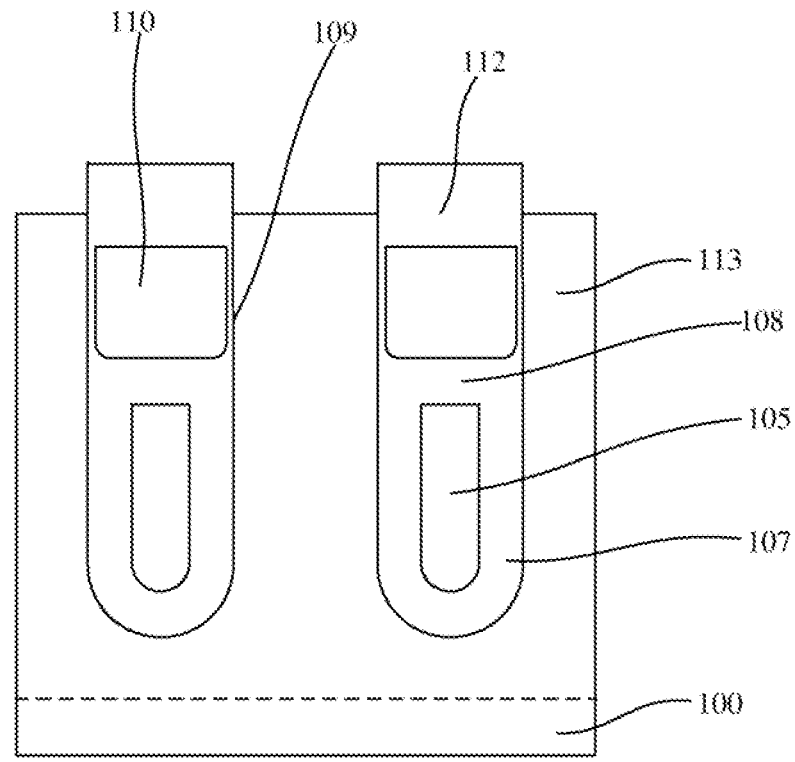
FIG. 10 is a diagram of after etching an epitaxial layer based on a second isolation dielectric layer in manufacturing of a trench field effect transistor consistent with the present disclosure.
Figure 11:
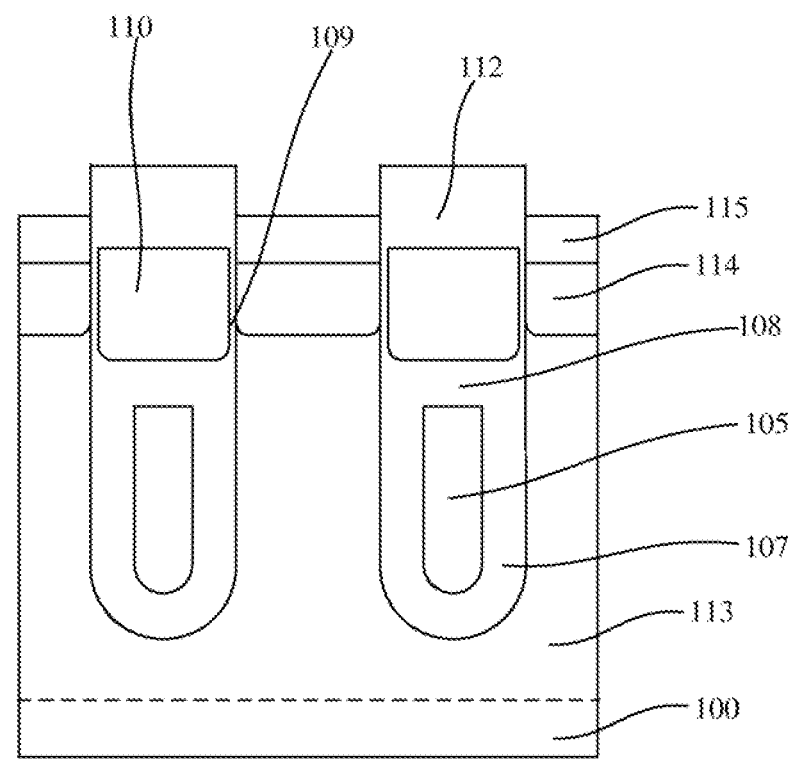
FIG. 11 is a schematic structural diagram of forming a body region and a source in manufacturing of a trench field effect transistor consistent with the present disclosure.

As shown in S4 in FIG. 1 and shown in FIG. 8 and FIG. 9, a second isolation dielectric layer 112 that covers at least an exposed surface of the gate layer 110 is formed on the gate layer 110, and the device trench 102 is filled with the second isolation dielectric layer 112.

As an example, the step of forming the second isolation dielectric layer 112 includes the following.

First, a second isolation dielectric material layer 111 is formed on the gate layer 110, and the second isolation dielectric material layer 111 further extends onto the epitaxial layer 101 around the device trench 102. As shown in FIG. 8, the second isolation dielectric material layer 111 fills the device trench 102. The second isolation dielectric material layer 111 may be formed by using a chemical vapor deposition process, and a material of the second isolation dielectric material layer 111 includes, but is not limited to, silicon oxide.

Subsequently, at least the second isolation dielectric material layer 111 is back-etched to expose the upper surface of the epitaxial layer 101, to form the second isolation dielectric layer 112, and an upper surface of the second isolation dielectric layer 112 is flush with the upper surface of the epitaxial layer 101. In this case, there are only two materials of the epitaxial layer and the second isolation dielectric layer on a surface of a wafer, and the second isolation dielectric layer covers the gate layer, as shown in FIG. 9. The second isolation dielectric material layer may be back-etched by using a dry etching process or a wet etching process. In an example, after the gate dielectric layer 109 and the gate layer 110 shown in FIG. 8 are formed, the second isolation dielectric material layer 111 is deposited on the upper surface of the gate layer 110 and an exposed surface of the gate dielectric layer 109, and the gate dielectric layer 109 on the epitaxial layer 101 is back-etched while the second isolation dielectric material layer 111 on the epitaxial layer 101 is back-etched, so that thicknesses of material layers on the upper surface of the epitaxial layer 101 around the device trench 102 are zero. Preferably, the upper surface of the second isolation dielectric layer 112 is flush with the upper surface of the epitaxial layer 101. Certainly, the second isolation dielectric layer 112 may be alternatively lower than the upper surface of the epitaxial layer 101 under the premise of implementing the function thereof.

As shown in S5 in FIG. 1 and shown in FIG. 10 to FIG. 15, the epitaxial layer 101 around the device trench 102 is etched based on the second isolation dielectric layer 112, and ion implantation is performed on the etched epitaxial layer 113 in sequence based on the second isolation dielectric layer 112, to form a body region 114 of a second doping type and a source 115 of the first doping type located in the body region 114 between adjacent device trenches 102, a source contact hole 118 is formed in at least the source 115, and the source contact hole 118 runs through the source 115 and exposes the body region 114.

Specifically, in the previous step, the second isolation dielectric layer 112 is formed in the device trench 102 and covers the gate layer 110. In this step, self-aligned dry etching is performed on the epitaxial layer 101 around the device trench 102 based on the second isolation dielectric layer 112, to form a "U"-shaped opening in the surface of the epitaxial layer 101, so as to obtain the etched epitaxial layer 113. In an example, a distance between the upper surface of the epitaxial layer 101 before the etching and an upper surface of the etched epitaxial layer 113 is between 3 KA and 6 KA, that is, an etching depth is between 3 KA and 6 KA, which may be 3.5 KA or 4 KA. Further, based on this, ion implantation is performed on the etched epitaxial layer 113 based on the second isolation dielectric layer 112 in self-aligned with the body region 114 and the source 115 without preparing a mask and without being limited by a traditional photolithography process. The second doping type represents a doping type opposite to the first doping type, for example, if the first doping type is an N-type, the second doping type is a P-type, and if the first doping type is the P-type, the second doping type is the N-type. In an example, a doping type of the body region 114 is opposite to the doping types of the epitaxial layer 101 and the substrate 100. In this example, the second doping type is the P-type, and the body region 114 is a P-doped body region 114 . In addition, an ion doping type of the source 115 is the same as the doping types of the epitaxial layer 101 and the substrate 100 and is opposite to the doping type of the body region 114. In this example, the source 115 is an N+ type doped silicon.

Figure 12:
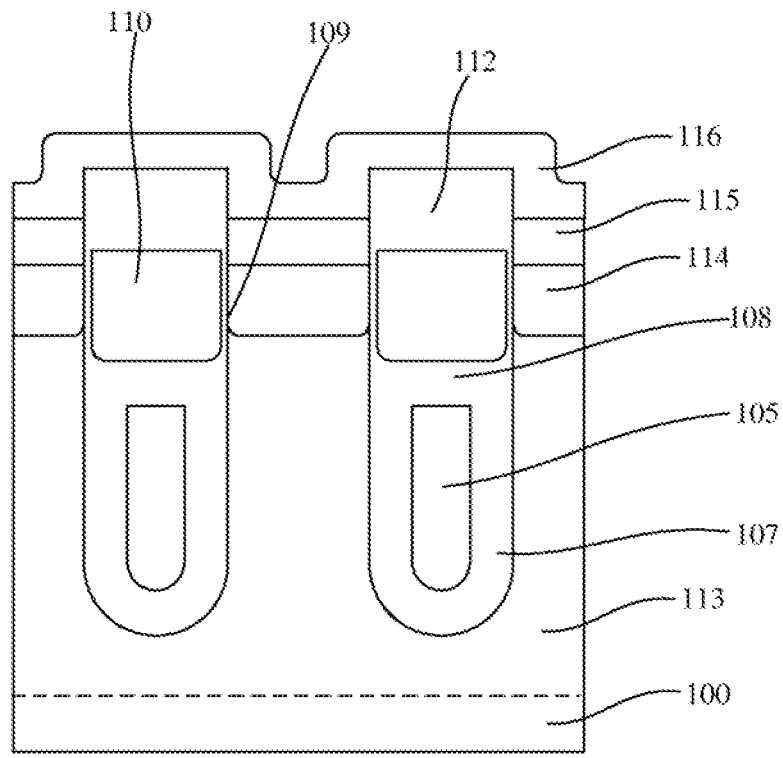
FIG. 12 is a schematic diagram of forming a self-aligned etching masking layer in manufacturing of a trench field effect transistor consistent with the present disclosure.

In addition, as an example, the step of forming the source contact hole 118 includes the following:

First, a continuous self-aligned etching masking layer 116 may be formed on the second isolation dielectric layer 112 and the source 115 around the second isolation dielectric layer 112 by using a chemical vapor deposition process or the like, as shown in FIG. 12. A material of the self-aligned etching masking layer 116 may be silicon oxide or silicon nitride, but is not limited thereto.

Figure 13:
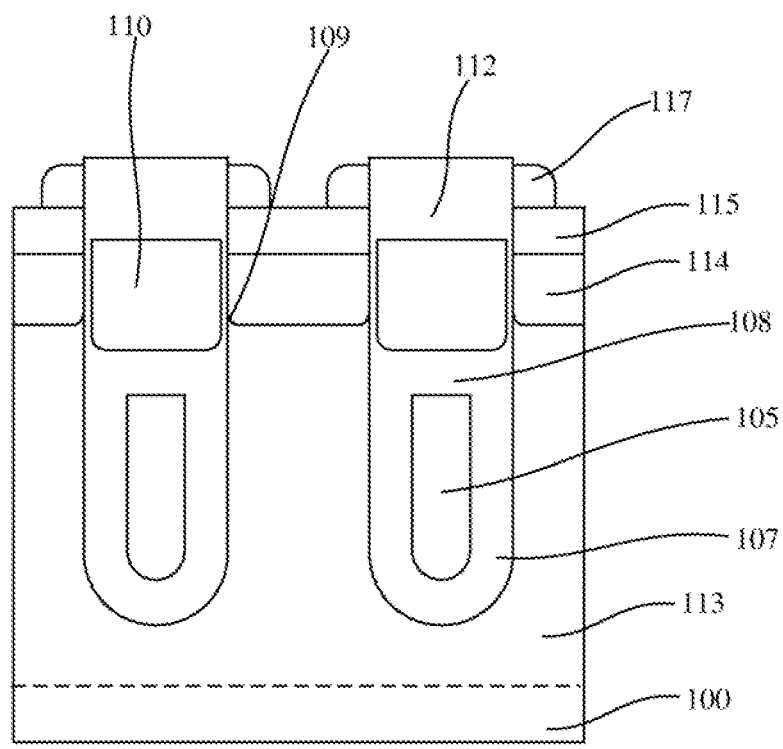
FIG. 13 is a schematic structural diagram of forming a spacer in manufacturing of a trench field effect transistor consistent with the present disclosure.

Subsequently, the self-aligned etching masking layer 116 is etched to expose the source 115, to form spacers 117 located on two sides of the second isolation dielectric layer 112 and located on the source 115 around the second isolation dielectric layer 112, as shown in FIG. 13. The self-aligned etching masking layer may be directly etched by using an anisotropic dry etching process without preparing a mask, and the second isolation dielectric layer 112 or the source 115 is used as a detected object at an etching endpoint, so that an upper surface of the source 115 is exposed, and two spacers 117 having a spacing are formed between adjacent second isolation dielectric layers 112, that is, the spacers 117 are formed on two sides of the U-shaped opening.

Figure 14:
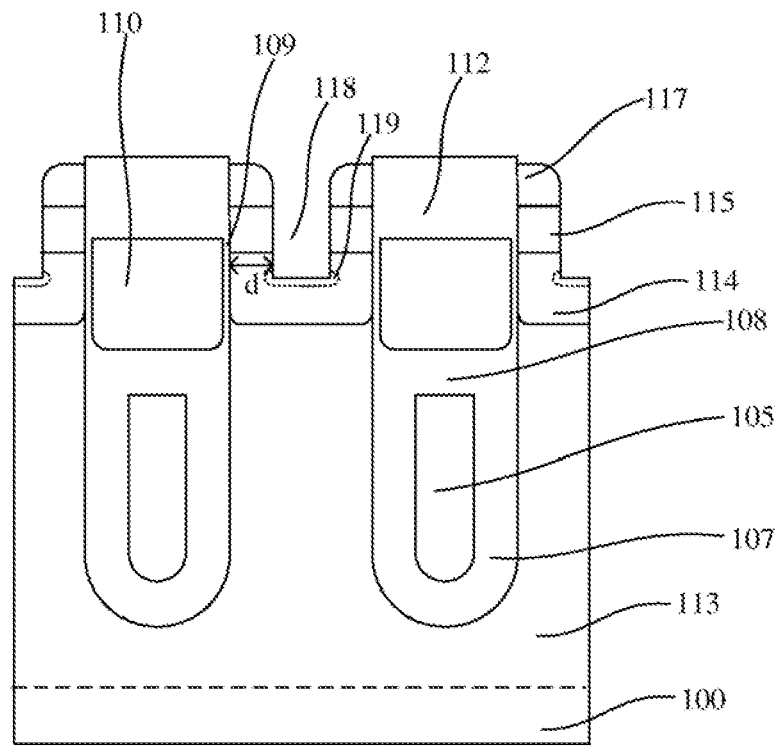
FIG. 14 is a schematic diagram of forming a source contact hole and a doping contact region in manufacturing of a trench field effect transistor consistent with the present disclosure.

Finally, self-aligned anisotropic etching is performed on the source 115 and the body region 114 based on the spacers 117, to form the source contact hole 118 as shown in FIG. 14. The spacer 117 is used as a barrier layer for etching the source contact hole 118 without preparing a masking layer and without being limited by a traditional photolithography process, thereby further reducing a device cell pitch, improving a cell density, and reducing a device channel resistance. On the other hand, with the spacer 117 as a barrier, self-aligned anisotropic drying etching is performed on the epitaxial layer 101 to a target depth to form the source contact hole 118, a size of the source contact hole 118 depends on only a size of the U-shaped opening and a target thickness of the self-aligned etching masking layer 116, but the U-shaped opening is also formed by a self-alignment process, and the size of the formed source contact hole 118 is stable and controllable. In addition, during the device manufacturing, it is required to maintain a safety distance between the bottom of the source contact hole 118 and the channel, as shown in din FIG. 14, and the shielding gate dielectric layer 109 and the shielding gate layer 105 are required to have a particular thickness. Limited by the existing alignment accuracy, it is difficult to implement accurate alignment by using a traditional process, resulting in an unstable electrical parameter. However, in the present disclosure, the self-alignment technology is adopted, which is conducive to implementing accurate alignment, to cause the size required by the device structure to be easy to control, thereby improving the stability of the device electrical parameter, and obtaining a device structure with a small cell size, a high cell density, a low device channel resistance, a low specific on-resistance, and a stable electrical parameter.

As an example, in the step of etching the epitaxial layer 101 based on the second isolation dielectric layer 112, an upper surface of the etched epitaxial layer 113 is higher than the upper surface of the gate layer 110 and is lower than an upper surface of the second isolation dielectric layer 112. In addition, a lower surface of the body region 114 formed by performing ion implantation is higher than a lower surface of the gate layer 110, and a lower surface of the formed source 115 is lower than the upper surface of the gate layer 110. In another example, the formed source contact hole 118 further extends into the body region 114. In an example, a distance between the bottom of the source contact hole 118 and the upper surface the body region 114 is between 3 KA and 6 KA, which may be 4.5 KA or 5.5 KA.

As an example, after the forming of the source contact hole 118, the method further includes the following step: performing ion implantation on the body region 114 based on the source contact hole 118, to form a doping contact region 119 in the body region 114, where a doping type of the doping contact region 119 is consistent with the doping type of the body region 114, and the doping contact region 119 is in contact with the source electrode structure 122. Ion implantation is performed on the body region 114 by using an ion implantation process. In an example, ion implantation is performed based on the source contact hole 118, and the doping type of the doping contact region 119 is consistent with the doping type of the body region 114. In an example, a doping concentration of the doping contact region 119 is greater than a doping concentration of the body region 114. In this embodiment, P+ type doped is selected, to reduce a contact resistance.

Figure 15:
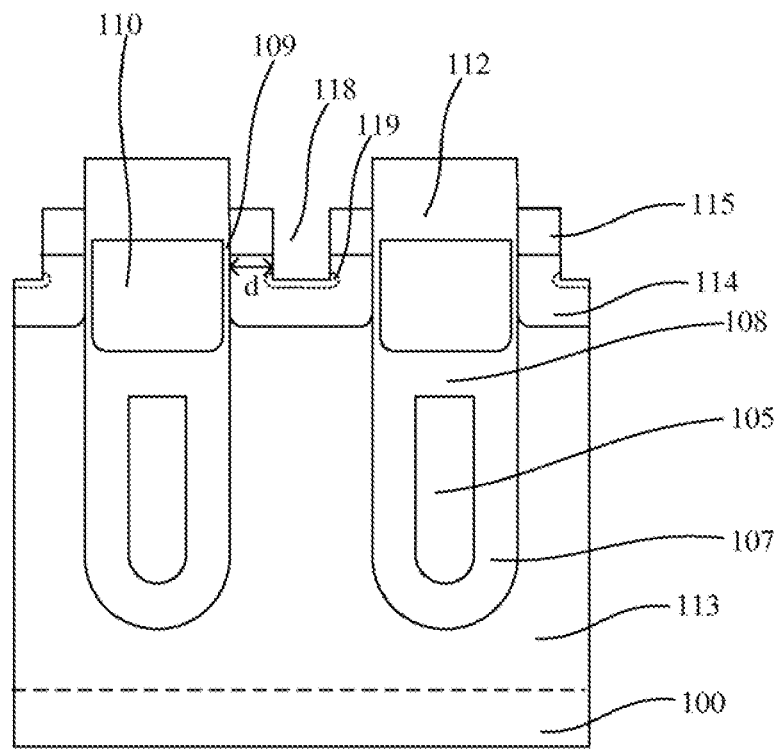
FIG. 15 is a schematic structural diagram of removing a spacer in manufacturing of a trench field effect transistor consistent with the present disclosure.
Figure 16:
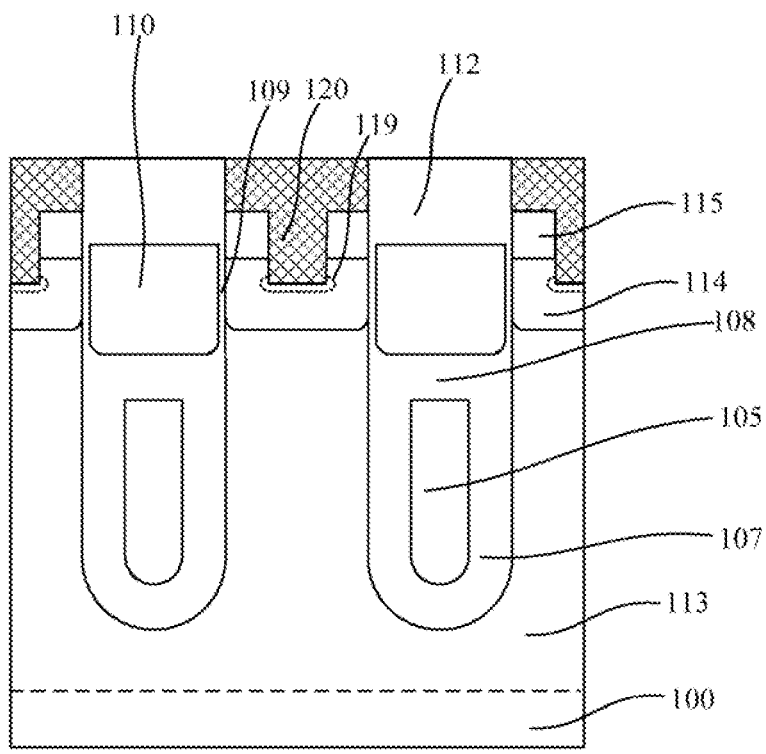
FIG. 16 is a schematic structural diagram of forming a filling portion in manufacturing of a trench field effect transistor consistent with the present disclosure.
Figure 17:
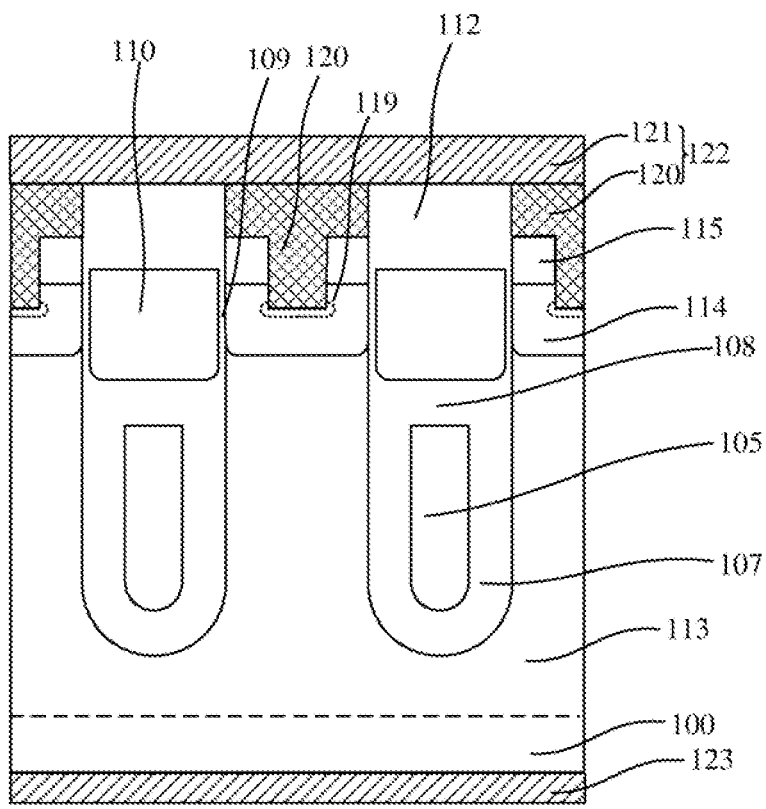
FIG. 17 is a diagram of forming a source contact electrode and a drain contact electrode in manufacturing of a trench field effect transistor consistent with the present disclosure.

As shown in S6 in FIG. 1 and shown in FIG. 15 to FIG. 17, a source electrode structure 122 electrically connected to both the source 115 and the body region 114 is formed in at least the source contact hole 118, and a drain electrode structure 123 electrically connected to the substrate 100 is formed on one side of the substrate 100 away from the epitaxial layer 101.

Specifically, the source electrode structure 122 fills at least the source contact hole 118 and is electrically connected to both the source 115 and the body region 114, so that the source and the body region may be electrically lead out. In an example, the source electrode structure 122 includes a plurality of filling portions 120 and a cover portion 121 covering the filling portions 120. The filling portion 120 fills at least the source contact hole 118, and an upper surface of the filling portion 120 is not higher than the upper surface of the second isolation dielectric layer 112, the filling portion 120 and the source contact hole 118 are in one-to-one correspondence. The filling portion 120 is electrically connected to the source 115 and the body region 114. The cover portion 121 covers the filling portions 120, to electrically lead out the filling portions 120. The cover portion 121 further extends to cover the second isolation dielectric layer 112 around the filling portion 120. In addition, a material of the filling portion 120 may be metallic tungsten, aluminum, titanium, or the like, or may be highly doped polysilicon. In another example, metallic titanium, titanium nitride, and tungsten may be alternatively deposited sequentially. Tungsten, titanium nitride, and titanium are sequentially dry-etched or wet-etched to a target depth to form the filling portion 120, which is not limited thereto. The cover portion 121 and the drain electrode structure 123 are deposited again, and the materials of the cover portion 121 and the drain electrode structure 123 may be selected as a conductive metal.

As an example, before forming the source electrode structure 122, the method further includes a step of removing the spacers 117. The spacers 117 may be removed by using a dry etching process or a wet etching process. In this case, the source electrode structure 122 fills the source contact hole 118 and further extends onto at least the source 115 around the source contact hole 118 between the adjacent second isolation dielectric layers 112, that is, the source electrode structure 122 forms a T-shaped contact structure. In an example, when the source 115 includes the filling portion 120 and the cover portion 121, the filling portion 120 is the T-shaped contact structure, and the T-shaped contact structure increases a contact area of the source 115 and the body region 114, thereby effectively reducing a contact resistance of the source 115 and increasing an avalanche energy of the device.

In addition, as shown in FIG. 17, referring to FIG. 1 to FIG. 16, the present disclosure further provides a trench field effect transistor structure. The trench field effect transistor structure is preferably manufactured by using the manufacturing method consistent with the present disclosure, or certainly may be manufactured by using another method, which is not limited to thereto. The trench field effect transistor structure includes: a substrate 100, an epitaxial layer 101, a device trench 102 formed in the epitaxial layer 101, a shielding dielectric layer 107, a shielding gate layer 105, a first isolation dielectric layer 108, a gate dielectric layer 109, a gate layer 110, a second isolation dielectric layer 112, a body region 114, a source 115, a source contact hole 118 formed in the source 115 and exposing the body region 114, a source electrode structure 122, and a drain electrode structure 123.

The substrate 100 has a first doping type, and the first doping type (that is, a first conductivity type) may be P-type doping or N-type doping. In addition, in an example, the substrate s may be a heavily doped substrate, for example, concentrations of first doping type ions doped in the substrate 100 may be greater than or equal to $1*10^{19}/cm^3$. The substrate 100 may be a silicon substrate, a germanium silicon substrate, a silicon carbide substrate, or the like. In this example, the substrate 100 is an N++-type doped silicon substrate such as 0.001-0.003 ohm*cm.

The epitaxial layer 101 is formed on the substrate 100 and has the first doping type. In an example, a doping concentration of the epitaxial layer 101 is less than that of the substrate 100. In this example, the epitaxial layer 101 is an N-type monocrystalline silicon epitaxial layer 101. In addition, a plurality of device trenches 102 are formed in the epitaxial layer 101, and a quantity of device trenches 102 and an arrangement relationship between the device trenches are set according to an actual condition. For example, the device trenches may be a plurality of strip-shaped device trenches 102 arranged in parallel at intervals. It should be noted that, in an example, the epitaxial layer 101 is the epitaxial layer 101 obtained by etching in the manufacturing method for a trench field effect transistor structure according to this embodiment.

As an example, the epitaxial layer 101 may be two or more stacked material layers with different concentrations of doping, and a quantity of material layers and a doping concentration of each material layer may be selected according to an actual requirement. In addition, when a plurality of material layers are formed, a position of the device trench 102 may be selected according to an actual requirement, and a specific resistance of the device may be improved based on the setting. For example, the epitaxial layer 101 includes two material layers, the bottom of the device trench 102 is stopped on the upper material layer, that is, at a junction of the two material layers, and the device trench exposes the lower material layer.

The shielding dielectric layer 107 is formed on the bottom and a part of side walls of the device trench 102. A material of the shielding dielectric layer 107 may include, but is not limited to, silicon oxide. In an optional example, a thickness of the shielding dielectric layer 107 may be between 800 A and 9000 A, for example, may be 1000 A, 2000 A, or 8000 A, to achieve a good shielding effect.

The shielding gate layer 105 is formed on a surface of the shielding dielectric layer 107 and fills at least the bottom of the device trench 102, and a material of the shielding gate layer 105 may include, but is not limited to, polysilicon.

The first isolation dielectric layer 108 is formed on the shielding gate layer 105, the first s isolation dielectric layer 108 and the shielding dielectric layer 107 surround the shielding gate layer 105, and a material of the first isolation dielectric layer 108 includes, but is not limited to, a high-density plasma (HDP) oxide layer. In an example, an upper surface of the first isolation dielectric layer 108 is flush with an upper surface of the shielding dielectric layer 107, and a height of the first isolation dielectric layer 108 is between 1500 A and 4500 A, for example, may be 2000 A or 3000 A.

The gate dielectric layer is formed on a surface of the first isolation dielectric layer 108 and extends onto the upper surface of the shielding dielectric layer 107 and the inner wall of the device trench 102, and a gate trench is defined by the surface of the gate dielectric layer 109. The gate dielectric layer 109 may be a silicon oxide layer or a high dielectric constant dielectric layer, but is not limited thereto.

The gate layer 110 fills the gate trench, and an upper surface of the gate layer 110 is lower than an upper surface of the epitaxial layer 101. A material of the gate layer 110 includes, but is not limited to, polysilicon.

The second isolation dielectric layer 112 is formed on the gate layer 110 and covers at least an exposed surface of the gate layer 110, and the second isolation dielectric layer 112 and the gate dielectric layer 109 surround the gate layer 110. A material of the second isolation dielectric layer 112 includes, but is not limited to, silicon oxide. In an example, the second isolation dielectric layer 112 is higher than the upper surface of the epitaxial layer 101.

The body region 114 of the second doping type is formed in the epitaxial layer 101 between adjacent device trenches 102 and abuts the adjacent device trenches 102. In this example, the second doping type is a P-type, a P-doped body region 114 is selected for the body region 114, and the source 115 is formed in the body region 114 and has the first doping type, an ion doping type of the source 115 is the same as the doping types of the epitaxial layer 101 and the substrate 100, and is opposite to the doping type of the body region 114. In this example, an N+ type doped silicon is selected for the source 115. In addition, the source contact hole 118 that runs through the source 115 and exposes the body region 114 is formed in the source 115. In an example, the source contact hole 118 further extends into the body region 114.

The source electrode structure 122 fills at least the source contact hole 118 and is electrically connected to both the source 115 and the body region 114, and the drain electrode structure 123 is formed on one side of the substrate 100 away from the epitaxial layer 101 and is electrically connected to the substrate 100. The source electrode structure 122 is electrically connected to both the source 115 and the body region 114, so that the source and the body region may be electrically lead out. In an example, the source electrode structure 122 includes a plurality of filling portions 120 and a cover portion 121 covering the filling portions 120. The filling portion 120 fills at least the source contact hole 118, and an upper surface of the filling portion 120 is not higher than the upper surface of the second isolation dielectric layer 112, the filling portion 120 and the source contact hole 118 are in one-to-one correspondence, the filling portion 120 is electrically connected to the source 115 and the body region 114, the cover portion 121 covers the filling portions 120, to electrically lead out the filling portions 120, and the cover portion 121 further extends to cover the second isolation dielectric layer 112 around the filling portion 120. In addition, a material of the filling portion 120 may be metallic tungsten, aluminum, titanium, or the like, or may be highly doped polysilicon. In another example, metallic titanium, titanium nitride, and tungsten may be alternatively deposited sequentially. Tungsten, titanium nitride, and titanium are sequentially dry-etched or wet-etched to a target depth to form the filling portion 120, which is not limited thereto. The cover portion 121 and the drain electrode structure 123 are then deposited, and the materials of the cover portion 121 and the drain electrode structure 123 may be a conductive metal.

As an example, the upper surface of the epitaxial layer 101 is higher than the upper surface of the gate layer 110 and is lower than the upper surface of the second isolation dielectric layer 112, and the source electrode structure 122 fills the source contact hole 118 and further extends onto at least the source 115 around the source contact hole 118 between the adjacent second isolation dielectric layers 112, that is, the source electrode structure 122 forms a T-shaped contact structure. In an example, when the source 115 includes the filling portion 120 and the cover portion 121, the filling portion 120 is the T-shaped contact structure, and the T-shaped contact structure increases a contact area of the source 115 and the body region 114, thereby effectively reducing a contact resistance of the source 115 and increasing an avalanche energy of the device.

As an example, the trench field effect transistor structure further includes spacers 117 formed on two sides of the second isolation dielectric layer 112 and located at the source 115 around the second isolation dielectric layer 112.

As an example, the trench field effect transistor structure further includes a doping contact region 119, a doping type of the doping contact region 119 is the same as the doping type of the body region 114, and the doping contact region 119 is in contact with the source electrode structure 122. In an example, a doping concentration of the doping contact region 119 is greater than a doping concentration of the body region 114. In this embodiment, P+ type doped is selected, to reduce a contact resistance.

As an example, a lower surface of the body region 114 is higher than a lower surface of the gate layer 110, a lower surface of the source 115 is lower than the upper surface of the gate layer 110, and the source contact hole 118 is formed in the source 115 and further extends into the body region 114.

As described above, the present disclosure provides a trench field effect transistor structure and a manufacturing method, a self-alignment process is adopted in a manufacturing process, so that a cell unit pitch is not limited by an exposure capability and alignment accuracy of a lithography machine, to further reduce the cell unit pitch of a device, improve a cell density, and reduce a device channel resistance, so that a device structure with a stable electrical parameter and a low specific on-resistance is obtained. A source electrode structure of a "T"-shaped structure is disposed, to increase a contact area between the source electrode structure and a source and a contact area between the source electrode structure and a body region, thereby effectively reducing a source contact resistance and improving an avalanche tolerance of the device. Therefore, the present disclosure effectively overcomes various defects in the prior art, and has a high value in industrial use.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A manufacturing method for a trench field effect transistor structure, wherein the manufacturing method comprises the following steps:

providing a substrate of a first doping type, wherein the substrate comprises a first surface and a second surface opposite to each other;

forming an epitaxial layer of the first doping type on the first surface of the substrate;

forming a plurality of device trenches in the epitaxial layer;

forming a shielding dielectric layer on an inner wall of the plurality of device trenches, forming a shielding gate layer on a surface of the shielding dielectric layer, filling at least a bottom of the plurality of device trenches with the shielding gate layer, and forming a first isolation dielectric layer on the shielding gate layer, wherein the first isolation dielectric layer and the shielding dielectric layer surround the shielding gate layer;

forming a gate dielectric layer on at least side walls of the plurality of device trenches and the first isolation dielectric layer, so that a gate trench is defined by a surface of the gate dielectric layer, and filling the gate trench to form a gate layer, wherein an upper surface of the gate layer is lower than an upper surface of the epitaxial layer;

forming, on the gate layer, a second isolation dielectric layer covering at least an exposed surface of the gate layer, and filling the plurality of device trenches with the second isolation dielectric layer;

etching the epitaxial layer around the plurality of device trenches by using the second isolation dielectric layer as a mask, and performing ion implantation on the etched epitaxial layer in sequence by using the second isolation dielectric layer as a mask, to form, between adjacent device trenches of the plurality of device trenches, a body region of a second doping type and a source of the first doping type located in the body region, and forming a source contact hole at least in the source, wherein the source contact hole runs through the source and exposes the body region; wherein the source contact hole is formed by:

forming a continuous self-aligned etching masking layer on the second isolation dielectric layer and the source around the second isolation dielectric layer;

etching the continuous self-aligned etching masking layer to expose the source, to form spacers located on two sides of the second isolation dielectric layer and on the source around the second isolation dielectric layer; and performing self-aligned etching on the body region using the spacers as barriers, to form the source contact hole; and forming, at least in the source contact hole, a source electrode structure that is electrically connected to both the source and the body region, and forming, on the second surface of the substrate, a drain electrode structure electrically connected to the substrate.

2. The manufacturing method for a trench field effect transistor structure as in claim 1, wherein the step of forming the shielding dielectric layer, the shielding gate layer, and the first isolation dielectric layer comprises:

depositing a shielding dielectric material layer on the inner wall of the plurality of device trenches, wherein the shielding dielectric material layer further extends onto the epitaxial layer around the plurality of device trenches;

depositing a shielding gate material layer on a surface of the shielding dielectric material layer, wherein the shielding gate material layer fills the plurality of device trenches and extends onto the shielding dielectric material layer around the plurality of device trenches;

back-etching the shielding gate material layer, to form the shielding gate layer;

forming a first isolation dielectric material layer on the shielding gate layer, wherein the first isolation dielectric material layer fills the plurality of device trenches and extends onto the shielding dielectric material layer around the plurality of device trenches; and back-etching the first isolation dielectric material layer and the shielding dielectric material layer, to form the first isolation dielectric layer and the shielding dielectric layer, wherein an upper surface of the first isolation dielectric layer and an upper surface of the shielding dielectric layer are flush with each other and are both lower than the upper surface of the epitaxial layer.

3. The manufacturing method for a trench field effect transistor structure as in claim 1, wherein the step of forming the second isolation dielectric layer comprises:

forming a second isolation dielectric material layer on the gate layer, wherein the second isolation dielectric material layer further extends onto the epitaxial layer around the plurality of device trenches; and back-etching at least the second isolation dielectric material layer to expose the upper surface of the epitaxial layer, to form the second isolation dielectric layer, wherein an upper surface of the second isolation dielectric layer is flush with the upper surface of the epitaxial layer.

4. The manufacturing method for a trench field effect transistor structure as in claim 1, wherein in the step of etching the epitaxial layer by using the second isolation dielectric layer as a mask, an upper surface of the etched epitaxial layer is higher than the upper surface of the gate layer and is lower than an upper surface of the second isolation dielectric layer; a lower surface of the body region formed by performing ion implantation is higher than a lower surface of the gate layer, and a lower surface of the formed source is lower than the upper surface of the gate layer; and the formed source contact hole further extends into the body region.

5. The manufacturing method for a trench field effect transistor structure as in claim 1, wherein after the forming the source contact hole, the method further comprises the following step: performing ion implantation on the body region through the source contact hole, to form a doping contact region in the body region, wherein a doping type of the doping contact region is consistent with a doping type of the body region, and the doping contact region is in contact with the source electrode structure.

6. The manufacturing method for a trench field effect transistor structure as in claim 1, wherein the source electrode structure comprises a plurality of filling portions and a cover portion covering the plurality of filling portions, at least the source contact hole is filled with the plurality of filling portions, an upper surface of the plurality of filling portions is not higher than an upper surface of the second isolation dielectric layer, and the cover portion further extends to cover the second isolation dielectric layer around the plurality of filling portions.

7. The manufacturing method for a trench field effect transistor structure as in claim 1, wherein before the forming the source electrode structure, the method further comprises a step of removing the spacers, and the source electrode structure is filled in the source contact hole and further extends onto at least the source around the source contact hole between adjacent second isolation dielectric layers.

8. The manufacturing method for a trench field effect transistor structure as in claim 1, wherein a material of the continuous self-aligned etching masking layer is silicon oxide or silicon nitride.

9. The manufacturing method for a trench field effect transistor structure as in claim 1, wherein the continuous self-aligned etching masking layer is etched by using an anisotropic dry etching process without mask preparation.

10. The manufacturing method for a trench field effect transistor structure as in claim 1, wherein during etching of the continuous self-aligned etching masking layer, the second isolation dielectric layer or the source is used as a detected object indicating an etching endpoint.

11. The manufacturing method for a trench field effect transistor structure as in claim 1, wherein the self-aligned etching on the body region using the spacers as barriers is an anisotropic dry etching.

12. A trench field effect transistor structure, comprising:
a substrate, having a first doping type and comprising a first surface and a second surface opposite to each other;
an epitaxial layer, having the first doping type and formed on the first surface of the substrate, wherein a plurality of device trenches are formed in the epitaxial layer;
a shielding dielectric layer, formed on a bottom and a part of side walls of the plurality of device trenches;
a shielding gate layer, formed on a surface of the shielding dielectric layer and filling at least the bottom of the plurality of device trenches;
a first isolation dielectric layer, formed on the shielding gate layer, wherein the first isolation dielectric layer and the shielding dielectric layer surround the shielding gate layer;
a gate dielectric layer, formed on at least the side walls of the plurality of device trenches and a surface of the first isolation dielectric layer, wherein a gate trench is defined by a surface of the gate dielectric layer;
a gate layer, filling the gate trench, wherein an upper surface of the gate layer is lower than an upper surface of the epitaxial layer;
a second isolation dielectric layer, formed on the gate layer and covering at least an exposed surface of the gate layer;
a body region, having a second doping type and formed in the epitaxial layer between adjacent device trenches of the plurality of device trenches;
a source, having the first doping type and formed in the body region, wherein a source contact hole running through the source and exposing the body region is formed in the source;
a source electrode structure, filling at least the source contact hole and electrically connected to both the source and the body region, wherein the source electrode structure comprises a plurality of filling portions that are T-shaped and a cover portion covering the plurality of filling portions, at least the source contact hole is filled with the plurality of filling portions, an upper surface of the plurality of filling portions is not higher than an upper surface of the second isolation dielectric layer, and the cover portion further extends to cover the second isolation dielectric layer around the plurality of filling portions;
spacers, wherein the spacers are formed on two sides of the second isolation dielectric layer and are located on the source around the second isolation dielectric layer; and
a drain electrode structure, formed on the second surface of the substrate and electrically connected to the substrate.

13. The trench field effect transistor structure as in claim 12, further comprising a doping contact region, wherein a doping type of the doping contact region is consistent with a doping type of the body region, and the doping contact region is in contact with the source electrode structure.

14. The trench field effect transistor structure as in claim 12, wherein a lower surface of the body region is higher than a lower surface of the gate layer, a lower surface of the source is lower than the upper surface of the gate layer, and the source contact hole is formed in the source and further extends into the body region.

15. The trench field effect transistor structure as in claim 12, wherein the upper surface of the epitaxial layer is higher than the upper surface of the gate layer and is lower than an upper surface of the second isolation dielectric layer, and the source electrode structure fills the source contact hole and further extends onto at least the source around the source contact hole between adjacent second isolation dielectric layers.

* * * * *